United States Patent
Chen et al.

(10) Patent No.: US 11,955,317 B2
(45) Date of Patent: Apr. 9, 2024

(54) RADIO FREQUENCY MATCH STRAP ASSEMBLY

(71) Applicant: Taiwan Semiconductor Manufacturing Company, Hsinchu (TW)

(72) Inventors: Ming-Sze Chen, Hsinchu (TW); Yu Li Wang, Hsinchu (TW); Yin-Tun Chou, Hsinchu (TW); Yuan-Hsin Chi, Longjing Township (TW); Sheng-Yuan Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 242 days.

(21) Appl. No.: 17/585,703

(22) Filed: Jan. 27, 2022

(65) Prior Publication Data

US 2022/0406569 A1 Dec. 22, 2022

Related U.S. Application Data

(60) Provisional application No. 63/212,435, filed on Jun. 18, 2021.

(51) Int. Cl.
*H01J 37/32* (2006.01)
*C23C 16/505* (2006.01)

(52) U.S. Cl.
CPC ...... *H01J 37/32183* (2013.01); *C23C 16/505* (2013.01); *H01J 2237/327* (2013.01); *H01J 2237/3321* (2013.01)

(58) Field of Classification Search
None
See application file for complete search history.

(56) References Cited

U.S. PATENT DOCUMENTS

2019/0318919 A1* 10/2019 Lyndaker .......... H01J 37/32935
2020/0343075 A1* 10/2020 Kim ........................ H01P 5/026

* cited by examiner

*Primary Examiner* — Dedei K Hammond
(74) *Attorney, Agent, or Firm* — Lippes Mathias LLP

(57) ABSTRACT

A radio frequency (RF) match assembly for a chemical vapor deposition processing chamber. The assembly includes a top electrically insulating column and a bottom electrically insulating column. The assembly further includes a one-piece RF match strap that has a head, a main body and a body extension. The main body of the one-piece RF match strap is configured to extend through the top electrically insulating column and the bottom electrically insulating column. A flexible chamber lid strap connects the processing chamber to the top of the one piece RF match strap.

20 Claims, 8 Drawing Sheets

RADIO FREQUENCY MATCH STRAP ASSEMBLY

PRIORITY CLAIM AND CROSS-REFERENCE

This application claims the benefit of U.S. Provisional Application Ser. No. 63/212,435 filed Jun. 18, 2021 and titled ONE PIECE RF MATCH STRAP FOR SACVD RF MATCH. U.S. Provisional U.S. Provisional Application Ser. No. 63/212,435 filed Jun. 18, 2021 and titled ONE PIECE RF MATCH STRAP FOR SACVD RF MATCH is incorporated herein by reference in its entirety

BACKGROUND

The following relates to impedance matching, radio-frequency matching, and sub-atmospheric pressure chemical vapor deposition. In chemical vapor deposition processing, radio frequency is used in the generation of plasma within the process chamber. High and low radio frequencies produced by radio frequency generators may interfere with each other. A radio frequency match is used to control the impedance and alleviate this interference.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
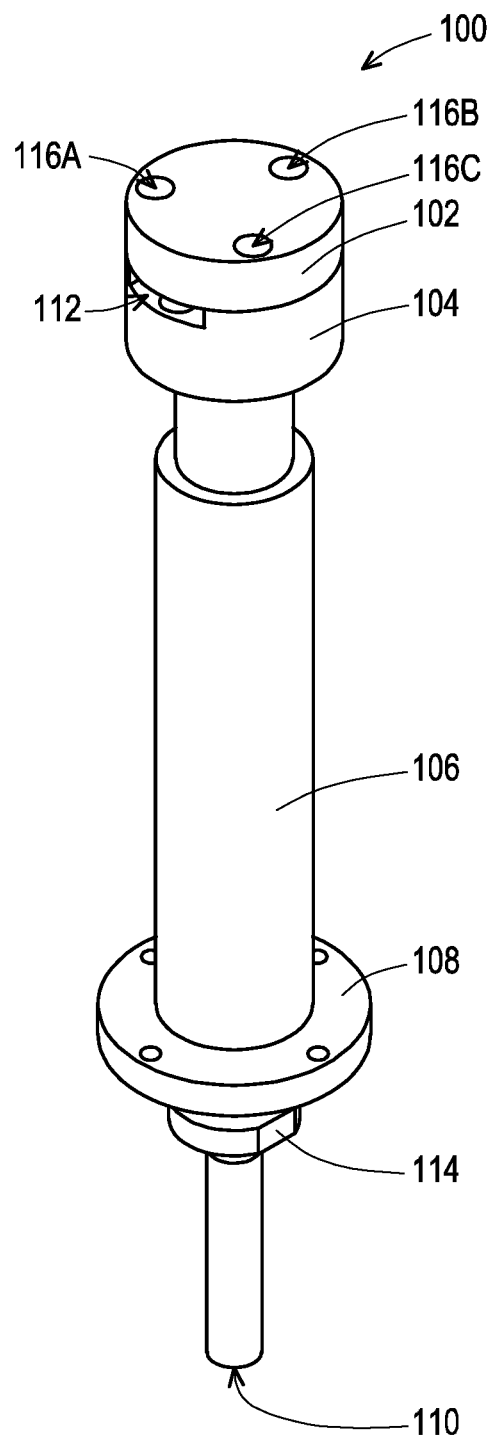
FIG. 1 is an illustration of a perspective view of a radio frequency match assembly in accordance with one embodiment of the subject application.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

In the fabrication of semiconductor microelectronic circuits, chemical vapor deposition processes are employed to fill deep narrow openings or high aspect ratio (HAR) openings, such as isolation trenches and deep contacts. The aspect ratio (the height to diameter ratio) may range from 5:1 to greater than 10:1. Several processes have been employed for this purpose, including sub-atmospheric chemical vapor deposition (SACAVD), plasma enhanced chemical vapor deposition (PECVD) and high density plasma chemical vapor deposition (HDPCVD).

The SACVD process, when used to deposit a silicon dioxide film, typically uses a metal-organic silicide gas a vacuum chamber containing the silicon wafer. The deposition reaction is a thermal reaction carried out at an elevated wafer temperature (e.g., about 500° C.), in which the heat dissociates free oxygen from the ozone gas and silicon from the TEOS molecules, and promotes surface mobility of deposited atoms on the coating. The deposition reaction is conformal, forming a coating of a nearly uniform thickness on both horizontal and vertical surfaces on the semiconductor wafer. Although the reaction is carried out in a vacuum, the chamber pressure is high (e.g., a few hundred Torr) relative to other CVD processes. This relatively high pressure is required to compensate for the slow deposition rate of the SACVD process. Although the wafer temperature is elevated during the deposition to about 500° C., the deposited coating must be annealed at about 700°-900° C.

The SACVD utilizes an RF power supply to provide high and low radio frequency power to the chamber for plasma processing. In each of these plasma processes, a gas is first introduced into a reaction chamber and then plasma is generated from the gas. This is accomplished by dissociation of the gas into ions, free radicals, and electrons by using an RF (radio frequency) power supply or generator, which includes one or more electrodes. The electrodes are accelerated in an electric field generated by the electrodes, and the energized electrons strike gas molecules to form additional ions, free radicals, and electrons, which strike additional gas molecules, and the plasma eventually becomes self-sustaining. The RF power supply may utilize a high frequency RF source and a low frequency RF source. In some instances, the high RF power is supplied to a gas distribution manifold within the chamber and the low RF power is supplied to an electrode that may be embedded in the pedestal or substrate holder within the chamber. Interference between the high and low frequency RF power is minimized across the top and bottom plasma sheaths by an external RF match unit that which matches the impedance at high frequency RF and the impedance of the decoupled low frequency. Otherwise, the interference would produce high voltages at the electrodes and potentially result in arcing at the gas distribution system damaging the showerhead. The use of a low frequency bottom plasma sheath and a predominantly high frequency top plasma sheath induces a harmonic oscillation frequency that may be increased or decreased by the external RF circuit as desired. The external RF match unit may be connected to the chamber through an RF match strap that couples a chamber lid strap (conductive strip of material) from the RF match strap to the process chamber.

In a typical RF coupling arrangement for providing RF power to an SACVD chamber or other process chamber, an RF match strap provides a low impedance RF connection to the RF match unit. The RF match strap includes an electrical conductor surrounded by an electrically nonconductive column providing electrical insulation. A separate chamber lid strap includes two parts: a fixed (i.e., rigid) chamber lid strap that secures to the top of the RF match strap, and a flexible chamber lid strap that runs from the fixed chamber lid strap to an RF port of the process chamber. The RF port is typically located on the lid of the process chamber.

As recognized herein, this multi-component RF coupling arrangement has some disadvantages. Each time the lid of the process chamber is opened or closed, the flexible chamber lid strap flexes against the fixed chamber lid strap, which in turn flexes against its connection with the top of the RF match strap. This produces cyclical stress over time at the connection between the chamber lid strap and the top of the RF match strap, which over time can lead to shifting of the chamber lid strap position and impaired RF coupling between the chamber lid strap and the top of the RF match strap. This in turn lead to reduced RF power transfer, reflected RF high power issues that may cause product defects, RF arcing, and the like.

In various embodiments disclosed herein, a robust RF coupling arrangement is disclosed which alleviates the foregoing issues. In some improved arrangements, a one piece RF match strap is provided, which eliminates the connection of the fixed chamber lid strap to the RF match strap. The one piece RF match strap comprises a rod, which fits into an electrically nonconductive column providing electrical insulation. The rod-shaped one piece RF match strap is configured at its lower end to connect with the RF match unit, and is configured at its upper end to connect directly with the flexible chamber lid strap thus eliminating the RF coupling between the fixed chamber lid strap and the RF match strap, so that the RF power is efficiently transferred from the RF match unit through the one piece RF match strap directly to the flexible chamber lid strap. The one piece RF match strap provides additional structural rigidity (in addition to structural support provided by the electrically nonconductive column) and provides a continuous RF power transfer path from the RF match unit to the flexible chamber lid strap.

Figure 2A:
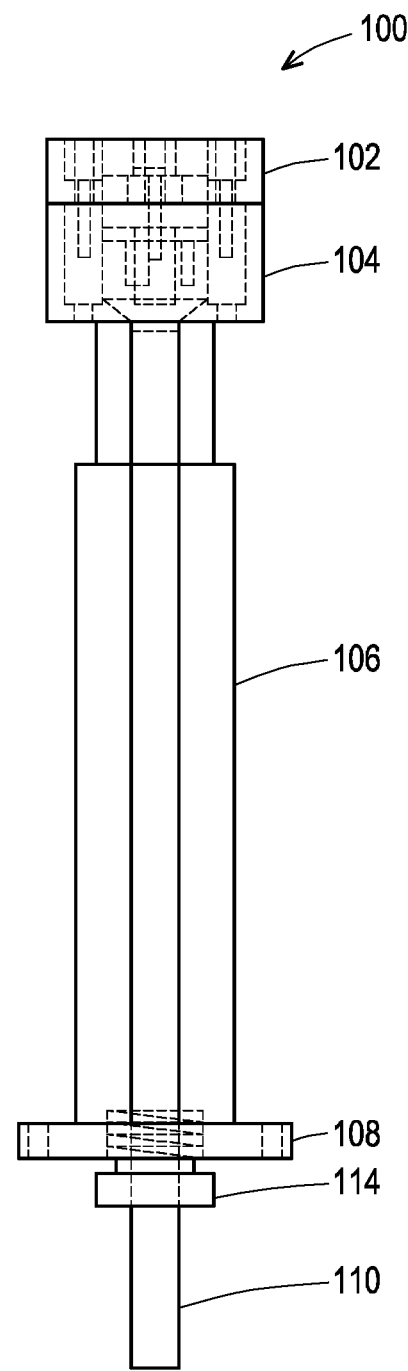
FIG. 2A is a schematic drawing of a side sectional view of the radio frequency match assembly of FIG. 1.
Figure 2B:
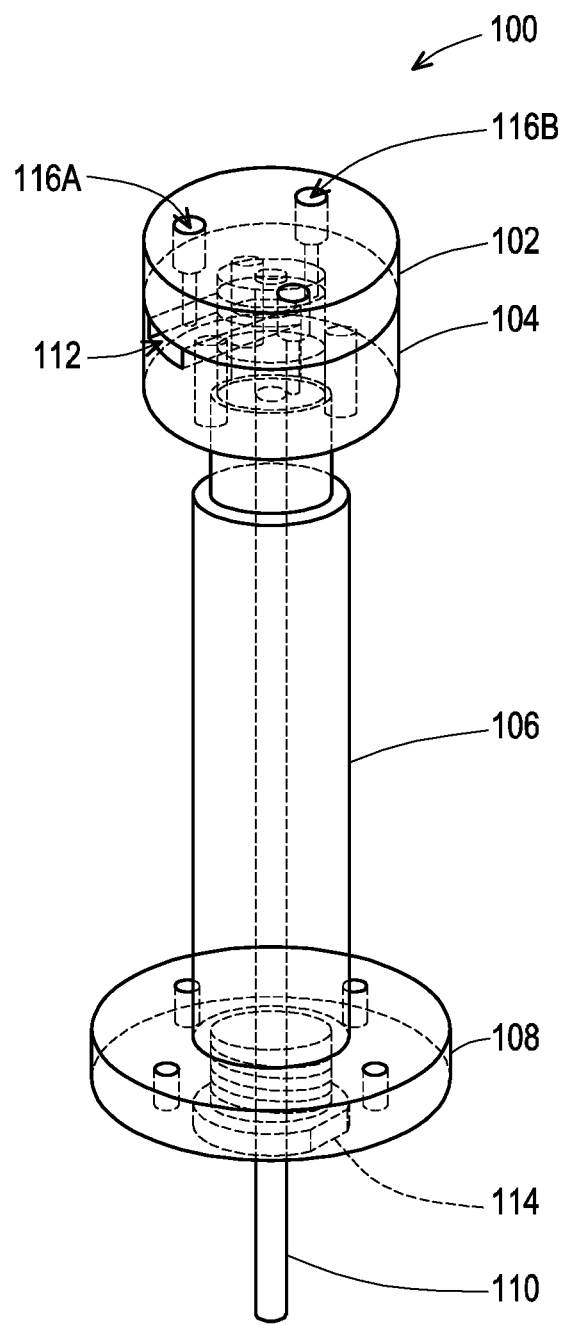
FIG. 2B is a perspective schematic drawing of a perspective view of the radio frequency match assembly of FIG. 1 with some components shown in transparency to reveal internal components.

Turning now to FIGS. 1-2B, there is shown an exemplary radio frequency (RF) match strap assembly 100 in accordance with one embodiment of the subject application. The RF match strap assembly 100 comprises a plurality of connective components, which are separately illustrated in FIGS. 3-4, discussed in greater detail below.

The RF match strap assembly 100 depicted in FIGS. 1-4 includes a top fixed column cover 102 removably attached to a top fixed (i.e. rigid) collar or column 104. The top fixed column cover 102 includes one or more recessed holes 116A, 116B, and 116C, that are configured to receive fasteners for securing the top fixed column cover 102 to the top fixed (i.e. rigid) column 104. As shown in FIG. 1, the coupling of the top fixed column cover 102 to the top fixed column 104 results in a chamber lid strap slot 112 formed therebetween. It will be appreciated by those skilled in the art that the slot 112 provides an ingress/egress for a flexible chamber lid strap (not shown in FIGS. 1-4, but see FIG. 6) to connect the RF match assembly 100 with an associated process chamber (not shown). This assembly is discussed in greater detail below with respect to FIGS. 5-6. The column cover 102 and top column 104 are electrically insulating for the RF power being conveyed.

Removably coupled to the top fixed column 104 is a bottom fixed (i.e. rigid) column 106, which is also electrically insulating for the RF power being conveyed, and includes a bottom fixed column flange 108 positioned on one end of the bottom fixed column 106 opposite the end to which the top fixed column 104 is coupled. The bottom fixed column flange 108 is suitably configured to secure the RF match strap assembly 100 to an RF match unit 504, as discussed in greater detail below. Extending through the top fixed column 104 and the bottom fixed column 106 is a one piece RF match strap 110, which extends through the end of the bottom fixed column 106 corresponding to the bottom fixed column flange 108. According to some embodiments contemplated herein, the one piece RF match strap 110 is configured to interact with internal components of the RF match 504, as discussed in greater detail below. FIG. 1 further illustrates a bottom fixed column cover 114 that is configured to allow the one piece RF match strap 110 to pass therethrough. In accordance with one embodiment, the bottom fixed column 106 includes internal threads configured to receive corresponding exterior threads of the bottom fixed column cover 114, thereby securing the one piece RF match strap 110 within the RF match strap assembly 100.

Figure 3:
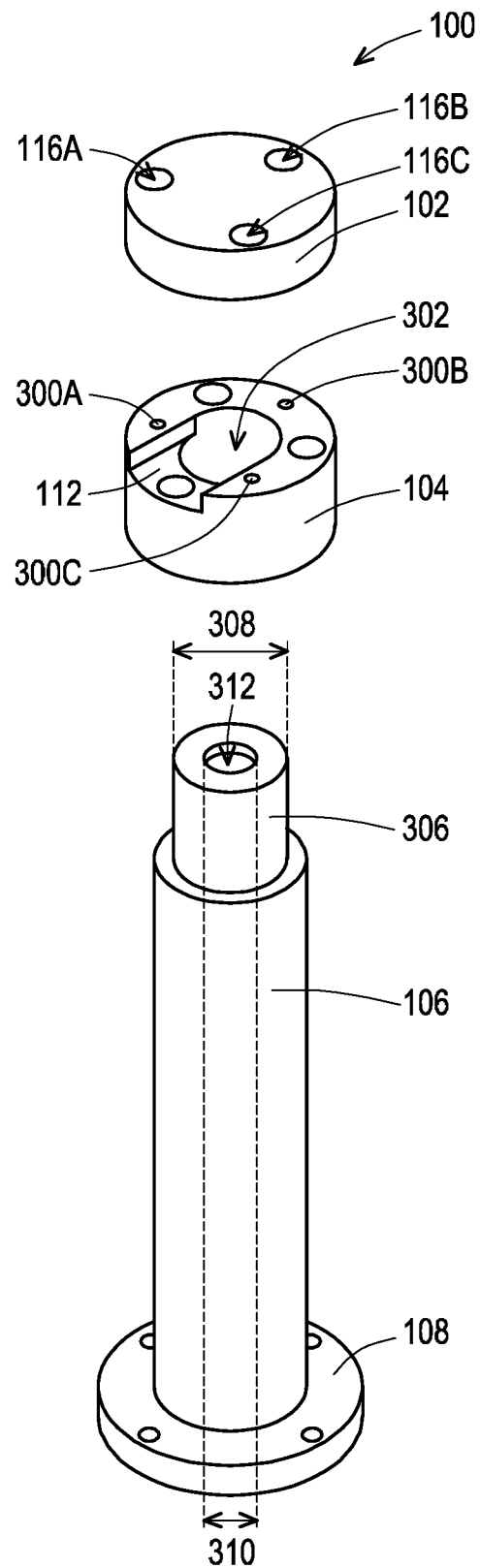
FIG. 3 is an illustration of an exploded perspective view of components of the radio frequency match assembly of FIG. 1 in accordance with one embodiment of the subject application.

Referring now to FIG. 3, there are shown an exploded perspective view of the separated electrically insulating top fixed column 104 and the bottom fixed column 106 in accordance with one embodiment of the subject application. As illustrated in FIG. 3, the top fixed column 104 includes a plurality of threaded holes 300A, 300B, and 300C configured to receive a fastener, e.g., screw, bolt, etc., (not shown) securing the top fixed column cover 102 to the top fixed column 104. It will be appreciated that the recessed holes 116A-C of the top fixed column cover 102 align with the threaded holes 300A-C, so as to allow for secure coupling of the top fixed column cover 102 with the top fixed column 104. FIG. 3 further illustrates the chamber lid strap slot 112, representing the ingress/egress of the flexible chamber lid strap (not shown) electrically coupling the RF match assembly 100 to the associated process chamber (not shown in FIG. 3). It will be appreciated by those skilled in the art that the dimensions of the chamber lid strap slot 112 defined by the top fixed column cover 102 and the top fixed column 104 may be dependent upon the size and type of chamber lid strap used. Thus, the illustration in FIG. 3 of the height, length, and width of the chamber lid strap slot 112 are intended to illustrate one exemplary formation of the chamber lid strap slot 112 and not to limit the size and shape thereof.

The top fixed column 104 is depicted as generally cylindrical in shape, having a hollow center 302 therethrough. The skilled artisan will appreciate that the cylindrical depiction of the top fixed column 104 is intended solely as an example, and other shapes, e.g., hexagonal, squared, oval, and the like, may also be utilized in accordance with vary aspects of the subject application.

The bottom fixed column 106 is also illustrated in FIG. 3, directly below the top fixed column 104. As shown in FIG. 3, the bottom fixed column 106 includes a tab component 306 on the end of the bottom fixed column 106 opposite the flange 108. The tab component 306, as depicted, comprises an outer diameter 308 that is smaller than the outer diameter of the bottom fixed column 106. In accordance with one embodiment, the outer diameter 308 of the tab component 306 is configured to slidably engage the hollow center 302 of the top fixed column 104. In accordance with another embodiment, the top of the tab component 306 is beveled to engage a corresponding portion of the top fixed column 104, as illustrated in FIGS. 2A-2B. As shown in FIG FIG. 3, the hole (hollow center) 302 has an inner diameter 304 larger than the outer diameter 308 of the tab component 306, enabling the tab component 306 to next inside the hollow center 302 of the top fixed column 104, thereby joining the top fixed column 104 and the bottom fixed column 106 together.

The bottom fixed column 106 further includes a central hole or passageway 312 extending therethrough, i.e., extending longitudinally from the top (i.e., the tab component 306) downward to the end to which the flange 108 is affixed. In accordance with one embodiment, the central hole 312 of the bottom fixed column 106 is configured to receive the one piece RF match strap 110, as discussed in greater detail below. In varying embodiments contemplated herein, the top fixed column cover 102, the top fixed column 104, the bottom fixed column 106, and/or the flange 108 may be constructed of a suitable electrically nonconductive material. Suitable nonconductive materials may include, for example and without limitation, plastics, thermoplastics (e.g., polyoxymethylene), ballistic plastics, acrylics, and/or other suitable nonconductive materials as will be appreciated by those skilled in the art. Not shown in FIG. 3 are one or more fasteners, e.g., threads, disposed on the end of the bottom fixed column 106 that are configured to engage threads of the bottom fixed column cover 114.

Figure 4:
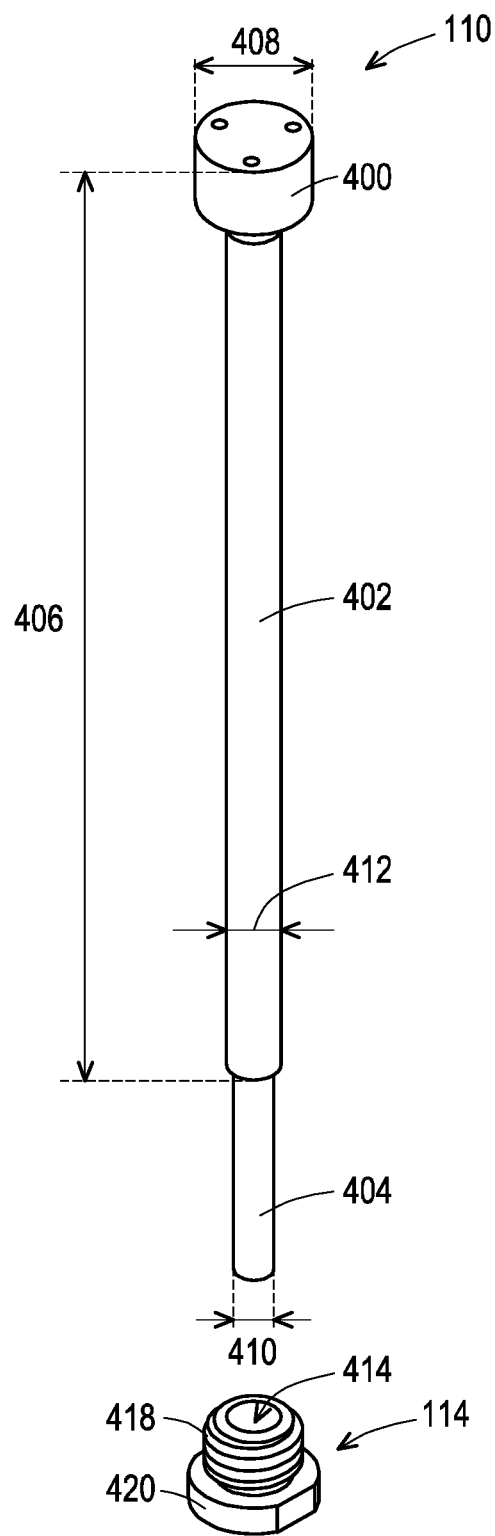
FIG. 4 is an illustration of a perspective view of a radio frequency match strap in accordance with one embodiment of the subject application.

Turning now to FIG. 4, there is shown a one piece RF match strap 110 in accordance with one exemplary embodiment of the subject application. As depicted in FIG. 4, the one piece RF match strap is generally cylindrical in shape, and has a top or head 400, a main body 402 and a body extension 404. In accordance with the embodiment illustrated in FIG. 4, the head 400 is positioned at a first end of the main body 402 and the body extension 404 is positioned at a second end of the main body 402, opposite the head 400. As shown, the head 400 is generally cylindrical in shape, having an outer diameter 408 configured to rest within the hollow center 302 of the top fixed column 104. The main body 402 extends downward from the head 400, with the body extension 404 extending longitudinally therefrom.

According to one embodiment, the body extension 404 has a diameter 410 smaller than the diameter 412 of the main body 402. In some embodiments, the diameter 412 of the main body 402 is suitably configured smaller than the inner diameter 310 of the fixed bottom column 106. In the illustrative embodiment the main rod 402 and rod extension 404 has a circular cross-section suitably described by a diameter. In other embodiments, these rod components 402, 404 may have other cross-sectional shapes, e.g. hexagonal or octagonal, and can be suitably described by another cross-sectional dimension suitable to that cross-sectional shape. Further, in such embodiments, the height 406 of the main body 402 and the head 400 is less than or equal to the combined heights of the top fixed column 104 and the bottom fixed column 106 when these two components are joined together. Thus, the skilled artisan will appreciate that the main body 402 and head 400 of the one piece RF match strap 110 are enclosed within the top fixed column 104 and the bottom fixed column 106, while the body extension 404 extends outward from the bottom of the bottom fixed column 104.

In some embodiments, the one piece RF match strap 110 is formed from a single piece of electrically conductive material, e.g., forged, milled from a single billet, created via additive manufacturing (i.e. sintering, 3D printing, etc.). Suitable examples of such conductive material include, for example and without limitation, aluminum, aluminum alloys, copper, copper alloys, and other suitable conductive materials, metals and alloys, as will be understood by one skilled in the art. It will further be appreciated that the head 400 and main body 402 cooperate to retain the flexible chamber lid strap (not shown) within the slot 112 formed by the top fixed column cover 102 and the top fixed column 104. The skilled artisan will further appreciate that such retention enables constant and sustained contact between the conductive material of the one piece RF match strap 110 and the chamber match strap (not shown), as will be illustrated in FIG. 6 below.

FIG. 4 further illustrates the bottom fixed column cover 114 utilized in one exemplary embodiment of the RF match assembly 100. As shown in FIG. 4, the bottom fixed column cover 114 includes a plurality of threads 418 positioned on an exterior of the cover 114 and configured to engage corresponding threads located on the bottom fixed column 106. The threads 418 of the cover 114 are located on the exterior of the cover 114 so as to engage the threads located on the interior of the bottom fixed column 106. In such an embodiment, the bottom fixed column cover 114 may have an outer diameter 416 corresponding to the inside diameter 310 of the bottom fixed column 106, as will be appreciated by those skilled in the art. The bottom fixed column cover 114 has an inner diameter 414 sized to allow passage of the body extension 404 through the center of the cover 114. In some embodiments, the inner diameter 414 may be sufficiently sized to allow at least a portion of the main body 402 to pass into the cover 114, e.g., the inner diameter 414 may be slightly larger in size than the diameter 412 of the main body 402. The bottom fixed column cover 114 further includes a lip 420 position on an end of the cover 114 opposite the threads. In some embodiments, the lip 420 is faceted or otherwise formed to allow a tool to secure the cover 114 to the bottom fixed column 106. In varying embodiments contemplated herein, the bottom fixed column cover 114 is constructed of a suitable nonconductive material. Suitable nonconductive materials may include, for example and without limitation, plastics, thermoplastics (e.g., polyoxymethylene), ballistic plastics, acrylics, and/or other suitable nonconductive materials as will be appreciated by those skilled in the art.

Figure 5:
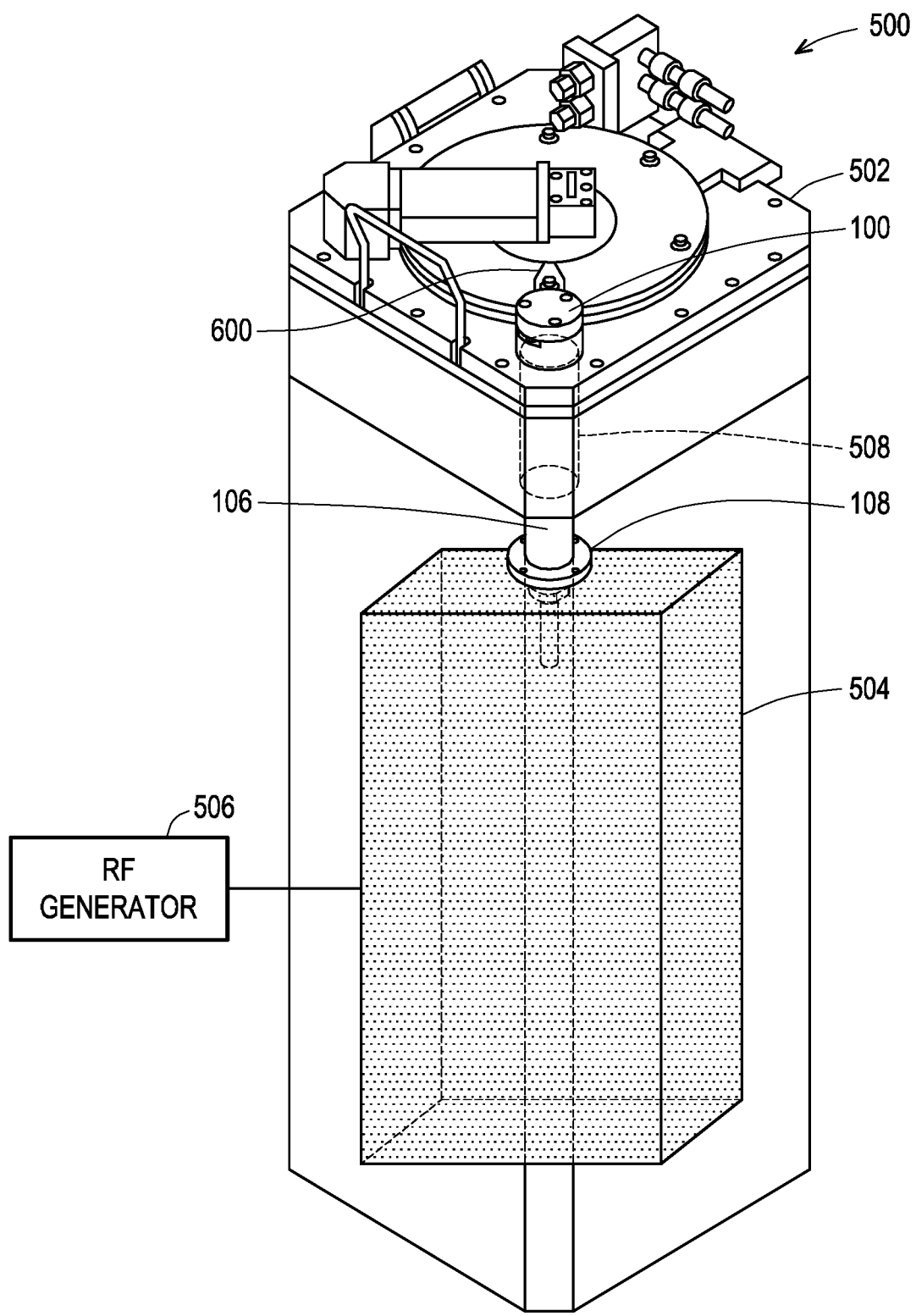
FIG. 5 is an illustration of a perspective view of a semiconductor manufacturing apparatus utilizing a radio frequency match assembly in accordance with one embodiment of the subject application.

Referring now to FIG. 5, there is shown a system 500 utilizing the RF match assembly 100 in accordance with one exemplary embodiment of the subject application. As shown in FIG. 5, the system 500 includes a process chamber 502, an RF match unit 504, and an RF generator 506. The process chamber 502 depicted in FIG. 5 may be, for example and without limitation, a chemical vapor deposition chamber, a sub-atmospheric pressure chemical vapor deposition chamber, a plasma enhanced chemical vapor deposition process chamber, plasma etching chamber, or other processing chambers used to deposit or etch dielectric, metal, or semiconductor layers on substrates. In accordance with one embodiment, the RF match unit 504 is any suitable radio frequency match capable of providing suitable impedance control to ensure maximum radio frequency power is supplied to the process chamber 502 from the associated radio frequency generator 506. The RF match unit 504 contains impedance matching circuitry tuned to facilitate coupling of both high frequency RF power from the RF generator 506 and low frequency RF power from the RF generator 506 to couple into the process chamber 502 with low impedance and minimal RF power loss or reflection.

The example embodiment illustrated in FIG. 5 depicts the RF match assembly 100 coupled to the RF match unit 504. In this illustration, the RF match assembly 100 is secured to the top of the RF match unit 504 via fasteners (not shown) extending through the bottom fixed column flange 108 and into the top of the RF match unit 504. The skilled artisan will appreciate that such attachment may utilize one or more fasteners and/or types of fasteners, in accordance with the type of material from with the casing of the RF match unit 504 is constructed. Although not shown, the skilled artisan will appreciate that the RF match strap 110 of the RF match assembly 100, particularly the body extension 404 and/or portion of the main body 402, extends into the RF match unit 504 and is suitably connected to impedance control circuitry contained therein.

The exemplary embodiment of FIG. 5 further illustrates that the RF match unit 504 is coupled or positioned to the outside of the process chamber 502 at a corner thereof. It will be appreciated by those skilled in the art that the positioning of the RF match unit 504 relative to the process chamber 502 may be dependent upon the type of process chamber, the location of contacts of the flexible chamber lid strap (see, e.g., FIG. 6), the length of the flexible chamber lid strap, and the like. In FIG. 5, the process chamber 502 is configured to accept the RF match assembly 100 via an orifice 508 that corresponds to a passage through a portion of the top of the process chamber 502. The location of the orifice 508, as will be appreciated by the skilled artisan, may allow for mounting of the RF match unit 504 to the process chamber 502, without interfering with the opening and/or closing of the process chamber 502, allowing ingress and egress of suitable wafers for deposition processing. The skilled artisan with further appreciate that the nonconductive material from which the top fixed column 104 and bottom fixed column 106 are made prevents RF loss as the RF match assembly 100 transits the orifice 508.

In accordance with one embodiment, the RF generator 506 provides both high and low radio frequency power to the process chamber 502 for plasma-enhanced processes. Interference between the high and low frequency RF power is minimized by the RF match unit 504, which matches the impedance at high RF and the impedance of the low (decoupled) frequency, to avoid the production of high voltages at the electrodes resulting in arcing at the gas distribution system. In order to ensure such matching is effective, the RF match unit 504 using the RF match assembly 100 is coupled to the process chamber 502 via the flexible chamber lid strap, as illustrated in FIG. 6.

Figure 6:
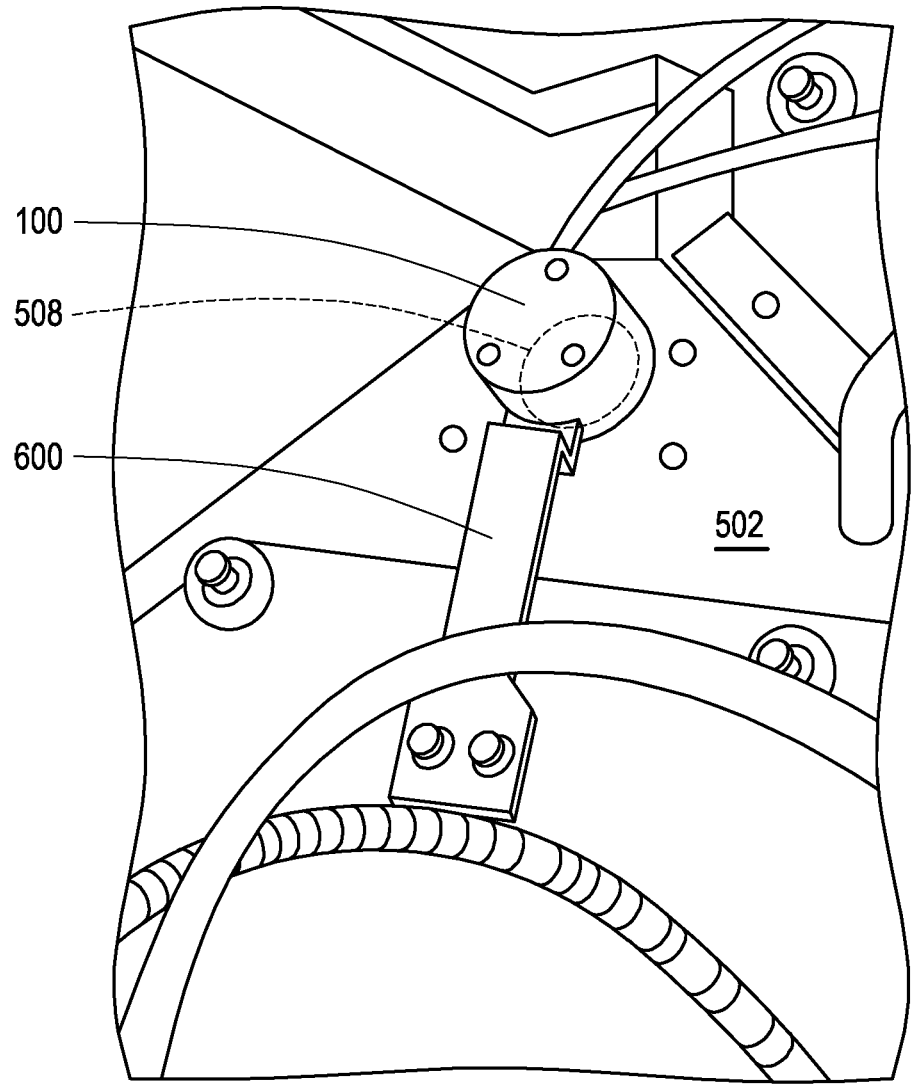
FIG. 6 is an illustration of a semiconductor manufacturing apparatus utilizing a radio frequency match assembly in accordance with one embodiment of the subject application.

As shown in FIG. 6, a close-up view of the coupling of the RF match assembly 100 and the process chamber 502 is depicted. This coupling is accomplished via the flexible chamber lid strap 600, that is secured to the one-piece RF match 110 within the assembly 100 and to the process chamber 502 as shown. Each time the lid of the process chamber 502 is opened or closed, the flexible chamber lid strap 600 flexes and imparts stress to its connection with the top of the one piece RF match 110. Advantageously, the flexible chamber lid strap 600 electrically contacts directly to the top of (e.g., the head 400 of) the one piece RF match 110, so that this cyclical flexing does not degrade the RF contact over time. In accordance with one embodiment, the flexible chamber lid strap 600 is sized to fit within the slot 112 formed between the top fixed column cover 102 and the top fixed column 104. In some embodiments, the flexible chamber lid strap 600 includes a suitable diameter hole through which the main body 402 of the RF match strap 110 passes. In such an embodiment, constant contact between the flexible chamber lid strap 600 and the RF match strap 110 is maintained by the head 400 contacting the flexible chamber lid strap 600. It will be appreciated that this contact may be maintained via securing of the top fixed column cover 102 to the top fixed column 104, which forces the head 400 of the RF match strap 110 to maintain contact with the flexible chamber lid strap 600. In an alternate embodiment, the flexible chamber lid strap 600 is sufficiently sized to slide into the slot 112 formed between the top fixed column cover 102 and the top fixed column 104. In this embodiment, the flexible chamber lid strap 600 slides under the head 400 of the RF match strap 110. Thereafter, securing the top fixed column cover 102 to the top fixed column 104 forces the head 400 down onto the flexible chamber lid strap 600.

Figure 7:
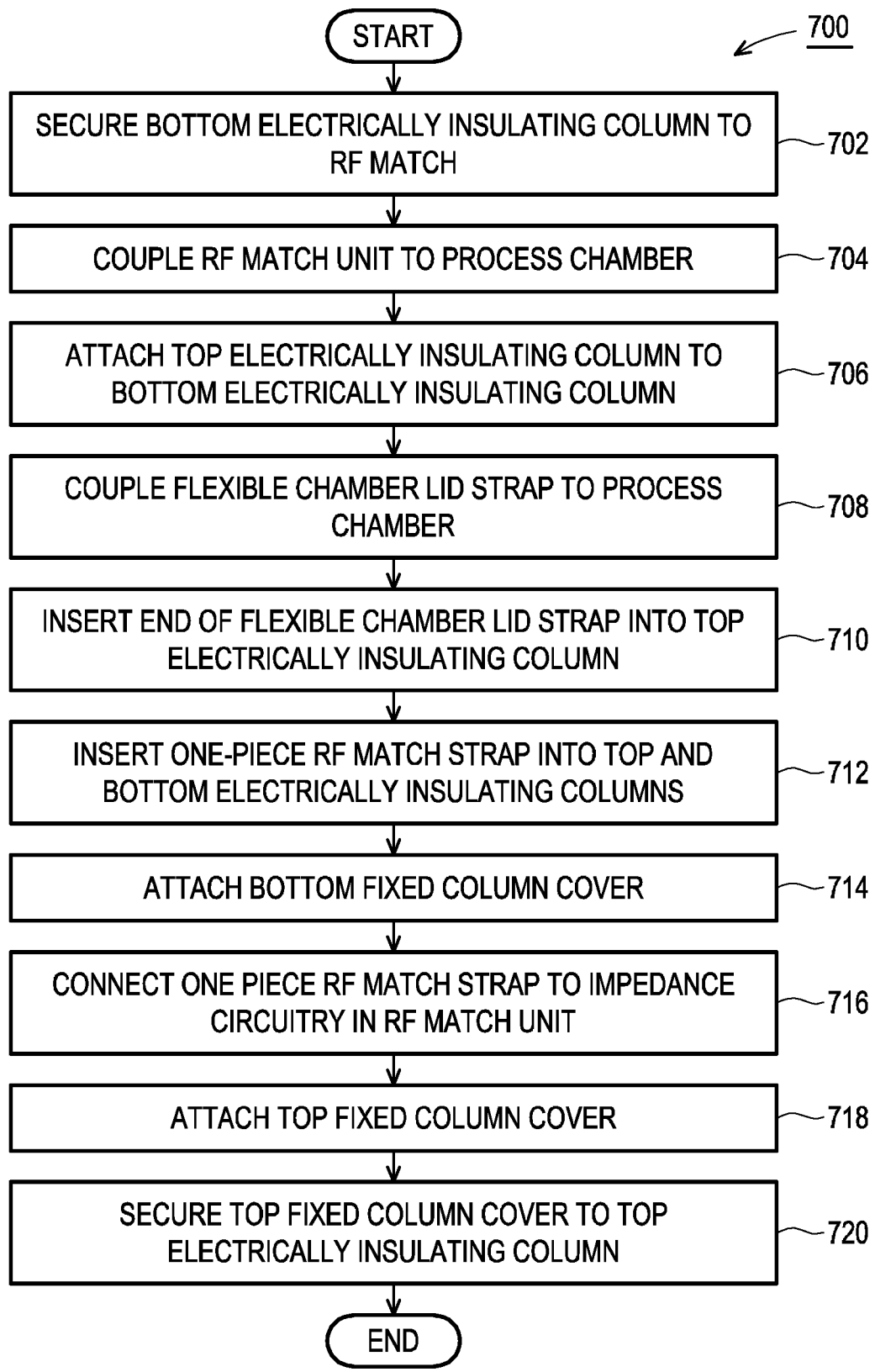
FIG. 7 is a flowchart illustrating a method for coupling a radio frequency match assembly to a semiconductor manufacturing apparatus in accordance with one embodiment of the subject application.

Turning now to FIG. 7, there is shown a flowchart illustrating a method 700 for coupling the RF match assembly 100 to the process chamber 502 in accordance with one embodiment of the subject application. The method begins at 702, whereupon the bottom fixed column 106 is secured to the RF match unit 504. Suitable attachment may include utilizing fasteners through the bottom fixed column flange 108 to the top of the RF match unit 504. In some embodiments, pre-threaded holes may be located on the RF match unit 504. Further, the skilled artisan will appreciate that a central hole through the top of the RF match unit 504 may also be present, allowing the RF match strap 110 to enter into the RF match unit 504 for connection to the necessary impedance control circuitry. At 704, the RF match unit 504 is coupled to the process chamber 502 at a preselected location. That is, the RF match unit 504 is suitably mounted to the process chamber 502 to allow passage of the attached bottom fixed column 106 through the orifice 508 to the top of the process chamber 502.

The top fixed column 104 is then slidably engaged onto the bottom fixed column 106 that has been mounted to the top of the RF match unit 504 at 706. In accordance with one embodiment, the top fixed column 104 is frictionally secured to the tab component 308 of the bottom fixed column 106. According to some embodiments contemplated herein, the top fixed column 104 is rotatable on the bottom fixed column 106 around the tab component 308, thereby enabling alignment of the slot 112 with the process chamber 502 and the flexible chamber lid strap 600.

At 708, the flexible chamber lid strap 600 is coupled to contact points on the top of the process chamber 502. It will be appreciated by those skilled in the art that the contact points are adjacent to the orifice 508, in close proximity thereto, or otherwise accessible to the RF match assembly 100. The skilled artisan will appreciate that the flexible chamber lid strap 600 may be a rigid conductive material, pre-shaped or bent into the appropriate configuration to couple the process chamber 502 to the RF match assembly 100 of the RF match unit 504. It will be appreciated by those skilled in the art that steps 706 and 708 may be performed in either order, as the rotatable coupling of the top fixed column 104 and the bottom fixed column 106 referenced above allow movement of the top fixed column 104 into the proper position.

At 710, an end of the flexible chamber lid strap 600 that is not secured to the top of the process chamber 502 is inserted to slot 112 partially formed by the top fixed column 104 that has been secured to the bottom fixed column 106. As discussed above, the end of the flexible chamber lid strap 600 to be connected to the RF match strap 110 may include a suitable opening through which the RF match strap 110 may pass, or alternatively may extend partially into the hole 302 of the top fixed column 104. At 712, the RF match strap 110 is inserted into the hole 302 of the top fixed column 104 and through the passageway 312 of the bottom fixed column 106 into the RF match unit 504. It will be appreciated that at this step, the head 400 of the RF match strap 110 contacts the end of the flexible chamber lid strap 600 inserted into the slot 112 of the top fixed column 104. That is, the underside of the head 400 is in contact with the flexible chamber lid strap 600, either circumferentially (via a hole through the flexible chamber lid strap 600) or with a portion of the flexible chamber lid strap 600 that has extended into the hole 302 of the top fixed column 104.

At 714, the bottom fixed column cover 114 is inserted around the one piece RF match strap 110 within the interior of the RF match unit 504 and threaded into the bottom fixed column 106, as discussed above. According to one embodiment, this step may be used when no fasteners are used to secure the flange 108 to the top of the RF match unit 504, i.e., when predrilled holes are not available or when use of metallic fasteners may have a negative impact on function of the RF match 504. In such an embodiment, the bottom fixed column cover 114 is utilized to secure the bottom fixed column 106 to the top of the RF match unit 504, i.e., the lip 420 extends around the hole through the top of the RF match unit 504 and the cover 114 is screwed/tightened to provide a secure coupling of the RF match assembly 100 to the RF match 504.

After securing the bottom fixed column cover 114, the RF match strap 110 is connected to the internal impedance circuitry of the RF match unit 504 at 716. It will be appreciated by those skilled in the art that such connection may include any suitable electrical connection known in the art to ensure proper conductivity, e.g., circuit block, friction connection, solder connection, or the like. After the one piece RF match strap 110 has been connected to the internal components of the RF match unit 504, operations proceed to 718, whereupon the top fixed column cover 102 is positioned on the top fixed column 104. At 720, fasteners are inserted into the holes 116A, 116B, and 116C of the top fixed column cover 102 to engage holes 300A, 300B, and 300C, respectively, of the top fixed column 104.

In accordance with one embodiment contemplated herein, the RF match assembly 100 enables contact between the RF match unit 504 and the process chamber 502 via secure coupling of the flexible chamber lid strap 600. The one-piece RF match strap 110 reduces RF power decay, reflected RF high power issues that may cause product defects, wafer arcing, and the like. Further, the aforementioned one-piece RF match strap 110 maintains constant and secure connection with the flexible chamber lid strap 600, even as the lid of the process chamber is repeatedly opened and closed providing less than 1 W of RF reflection.

In accordance with a first embodiment, there is provided a radio frequency (RF) match assembly for connecting RF power from an RF match unit to a process chamber. The assembly includes a top electrically insulating column and a bottom electrically insulating column. The assembly further includes a one-piece RF match strap that has a head, a main body and a body extension. The main body of the one-piece RF match strap is configured to extend through the top electrically insulating column and the bottom electrically insulating column. In addition, a top of the one-piece RF match strap is configured to electrically contact an associated flexible chamber lid strap of the process chamber and a bottom of the one-piece RF match strap is configured to electrical connect with the RF match unit.

In accordance with a second embodiment, there is provided a semiconductor manufacturing system. The system includes a process chamber, an RF match unit, an RF generator in electrical communication with the RF match unit, and an RF match assembly affixed to the RF match unit. The RF match assembly includes a top electrically insulating column, a bottom electrically insulating column coupled to a top of the RF match unit, and a one-piece RF match strap. The one-piece RF match strap includes a head, a main body and a body extension, with the main body extending through the top electrically insulating column and the bottom electrically insulating column into the RF match unit. The system further includes a flexible chamber lid strap connecting between a top of the one piece RF match strap assembly and the process chamber.

In accordance with a third embodiment, there is provided a method of coupling an RF match strap assembly to a semiconductor manufacturing apparatus that includes an RF match unit, a process chamber, and an RF generator. The method includes securing a bottom electrically insulating column of the RF match strap assembly to the RF match unit. The method further includes attaching a top electrically insulating column to the bottom electrically insulating column, and connecting a flexible chamber lid strap to the process chamber. The method also includes inserting the flexible chamber lid strap into a slot of the top electrically insulating column, and inserting a one piece RF match strap into the top electrically insulating column and the bottom electrically insulating column contacting the flexible chamber lid strap. In addition, the method includes attaching a bottom fixed column cover around the one piece RF match strap to the bottom electrically insulating column within the RF match unit, and attaching a top fixed column cover to the top electrically insulating column to secure the one piece RF match strap therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A radio frequency (RF) match assembly for connecting RF power from an RF match unit to a process chamber, comprising:
   a top electrically insulating column;
   a bottom electrically insulating column; and
   a one-piece RF match strap, the one-piece RF match strap having a head, a main body and a body extension, wherein the main body extends through the top fixed column and the bottom fixed column, and wherein a top of the one-piece RF match strap is configured to electrically contact an associated flexible chamber lid strap of the process chamber and a bottom of the one-piece RF match strap is configured to electrical connect with the RF match unit.

2. The RF match assembly of claim 1, wherein the top electrically insulating column further comprises a chamber lid strap slot configured to receive the associated flexible chamber lid strap.

3. The RF match assembly of claim 2, further comprising a top fixed column cover removably attached to the top electrically insulating column, wherein the top electrically insulating column is configured to secure the one-piece RF match strap therein.

4. The RF match assembly of claim 1, wherein at least a portion of the one-piece RF match strap extends outward from a bottom of the bottom electrically insulating column.

5. The RF match assembly of claim 1, wherein the top electrically insulating column further comprises a hole configured to retain the head of the one-piece RF match strap.

6. The RF match assembly of claim 1, wherein the one-piece RF match strap comprises a conductive material.

7. The RF match assembly of claim 6, wherein the top electrically insulating column and the bottom electrically insulating column comprise a non-conductive material selected from the group comprising plastics, thermoplastics, ballistic plastics, and acrylics.

8. The RF match assembly of claim 1, further comprising a bottom fixed column cover, the bottom fixed column cover configured to secure the bottom electrically insulating column to a wall of an associated RF match unit.

9. The RF match assembly of claim 1, wherein the bottom electrically insulating column further comprises a tab component configured to couple with the top electrically insulating column, the tab component having an outer diameter smaller than an outer diameter of the bottom electrically insulating column.

10. The RF match assembly of claim 9, wherein the bottom electrically insulating column further comprises a passageway extending longitudinally therethrough configured to receive the main body and body extension of the one-piece RF match strap.

11. A semiconductor manufacturing system, comprising:
    a process chamber;
    an RF match unit;
    an RF generator in electrical communication with the RF match unit;
    an RF match assembly affixed to the RF match unit, the assembly comprising:
       a top electrically insulating column;
       a bottom electrically insulating column coupled to a top of the RF match unit; and
       a one-piece RF match strap, the one-piece RF match strap having a head, a main body and a body extension, wherein the main body extends through the top electrically insulating column and the bottom electrically insulating column into the RF match unit; and
    a flexible chamber lid strap connecting between the process chamber and a top of the one piece RF match strap.

12. The system of claim 11, wherein the process chamber is a sub-atmospheric pressure chemical vapor deposition chamber.

13. The system of claim 12, wherein the RF match strap assembly further comprises a top fixed column cover removably attached to the top electrically insulating column, wherein the top electrically insulating column is configured to secure the one-piece RF match strap therein.

14. The system of claim 11, wherein the RF match strap assembly further comprises a bottom fixed column cover, the bottom fixed column cover configured to secure the bottom electrically insulating column to a wall of the RF match unit.

15. The system of claim 14, wherein at least one of the main body or the body extension of the one-piece RF match strap is coupled to an impedance circuit within the RF match unit.

16. The system of claim 11, wherein the one-piece RF match strap comprises a conductive material, and wherein the top electrically insulating column and the bottom electrically insulating column comprise a non-conductive material selected from the group consisting of plastics, thermoplastics, ballistic plastics, and acrylics.

17. A method of coupling an RF match strap assembly to a semiconductor manufacturing apparatus comprising an RF match unit, a process chamber, and an RF generator, the method, comprising:
    securing a bottom electrically insulating column of the RF match strap assembly to the RF match unit;
    attaching a top electrically insulating column to the bottom electrically insulating column;
    connecting a flexible chamber lid strap to the process chamber;
    inserting the flexible chamber lid strap into a slot of the top electrically insulating column;
    inserting a one piece RF match strap into the top electrically insulating column and the bottom electrically insulating column contacting the flexible chamber lid strap;
    attaching a bottom fixed column cover around the one piece RF match strap to the bottom electrically insulating column within the RF match unit; and
    attaching a top fixed column cover to the top electrically insulating column to secure the one piece RF match strap therein.

18. The method of claim 17, further comprising connecting the one piece RF match strap to impedance circuitry of the RF match unit.

19. The method of claim 18, wherein the process chamber is a sub-atmospheric pressure chemical vapor deposition chamber.

20. The method of claim 19, wherein the one-piece RF match strap comprises a conductive material.

* * * * *